United States Patent
Takanashi

(10) Patent No.: US 6,253,357 B1
(45) Date of Patent: Jun. 26, 2001

(54) ARRANGING/WIRING METHOD OF SEMICONDUCTOR DEVICE, AND SEMICONDUCTOR DEVICE ARRANGING/WIRING APPARATUS CAPABLE OF PREVENTING ERRONEOUS OPERATION OF ACTUAL DEVICE, WHILE REDUCING CHIP SIZE

(75) Inventor: Takeshi Takanashi, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/262,708

(22) Filed: Mar. 4, 1999

(30) Foreign Application Priority Data

Mar. 19, 1998 (JP) .................................................. 10-070630

(51) Int. Cl.⁷ ..................................................... G06F 17/50
(52) U.S. Cl. .................................................... 716/5; 716/11
(58) Field of Search ............................................ 716/5, 11

(56) References Cited

U.S. PATENT DOCUMENTS

| | | | |
|---|---|---|---|
| 5,531,572 | * | 7/1996 | Kimura et al. .......................... 716/11 |
| 5,787,268 | * | 7/1998 | Sugiyama et al. ...................... 716/11 |

FOREIGN PATENT DOCUMENTS

| | | |
|---|---|---|
| 5-47929 | 2/1993 | (JP) . |
| 6-188316 | 7/1994 | (JP) . |
| 7-153844 | 6/1995 | (JP) . |
| 7-175832 | 7/1995 | (JP) . |
| 9-81621 | 3/1997 | (JP) . |
| 9-116018 | 5/1997 | (JP) . |
| 9-153550 | 6/1997 | (JP) . |
| 10-22394 | 1/1998 | (JP) . |

* cited by examiner

Primary Examiner—Trong Phan
(74) Attorney, Agent, or Firm—Hutchins, Wheeler & Dittmar

(57) ABSTRACT

A method of arranging/wiring a core used to constitute a semiconductor device on a semiconductor chip includes a providing step, a step of arranging a core wiring line, a first performing step, a step of arranging the core, a making step and a second performing step. The providing step includes providing the core. The step of arranging the core wiring line includes arranging the core wiring line on the core. The first performing step includes performing a core operation check to the core on which the core wiring line is arranged. The step of arranging the core includes arranging the core to which the core operation check has been performed, on a semiconductor chip to produce an arranged core. The making step includes making a first wiring line capacitance of the core wiring line of the arranged core equal to a second wiring line capacitance of the core wiring line of the core when the core operation check of the core is performed. The second performing step includes performing a chip operation check to the semiconductor chip on which the arranged core is arranged under a condition that the first wiring line capacitance is equal to the second wiring line capacitance.

24 Claims, 7 Drawing Sheets

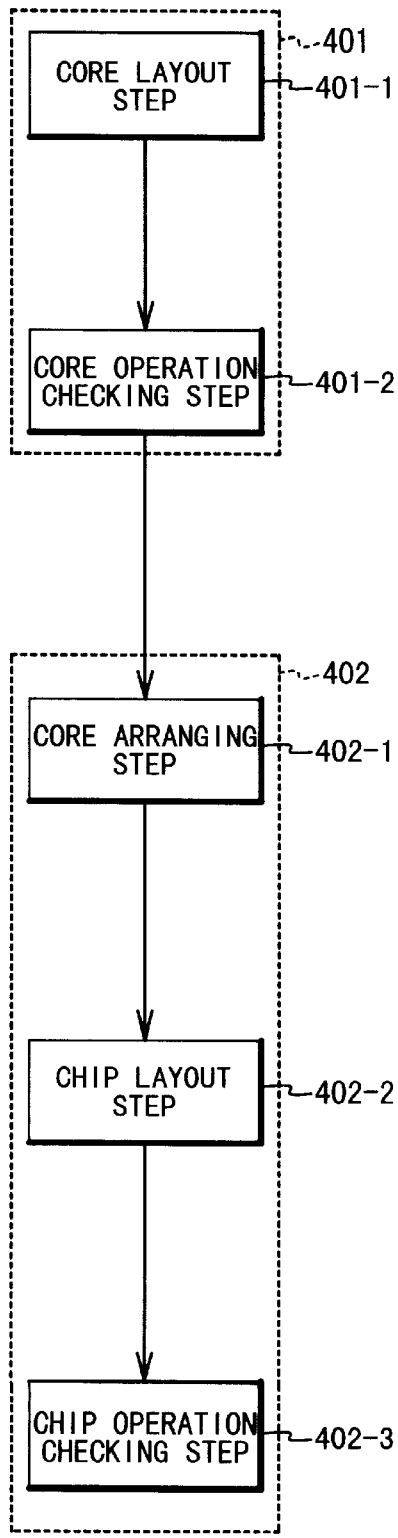
Fig. 2A
PRIOR ART
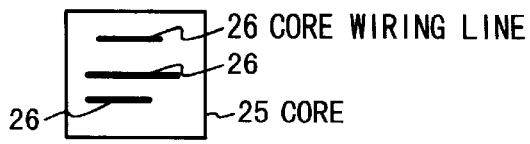
Fig. 2B
PRIOR ART
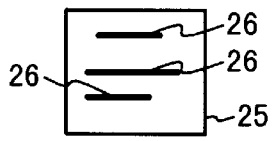
Fig. 2C
PRIOR ART
Fig. 2D
PRIOR ART
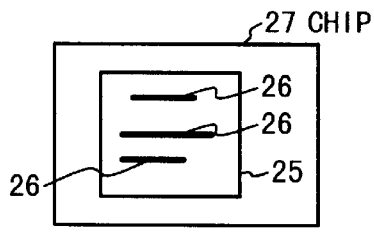
Fig. 2E
PRIOR ART
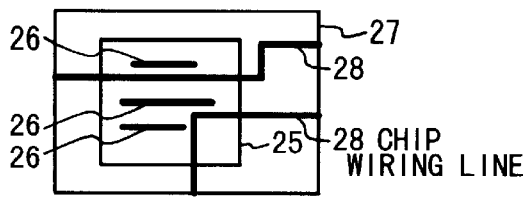
Fig. 2F
PRIOR ART
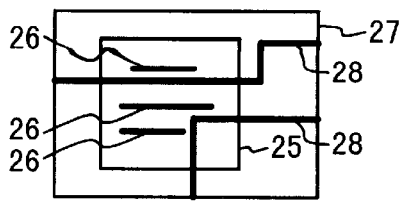

ARRANGING/WIRING METHOD OF SEMICONDUCTOR DEVICE, AND SEMICONDUCTOR DEVICE ARRANGING/WIRING APPARATUS CAPABLE OF PREVENTING ERRONEOUS OPERATION OF ACTUAL DEVICE, WHILE REDUCING CHIP SIZE

BACKGROUND OF THE INVENTION

1. Field of the Invention

The present invention generally relates to an arranging/wiring method of a semiconductor device, and also a semiconductor device arranging/wiring apparatus. More specifically, the present invention is directed to a semiconductor device arranging/wiring method and a semiconductor device arranging/wiring apparatus, suitable for a semiconductor integrated circuit that a so-called "core" is arranged within a semiconductor chip.

2. Description of the Related Art

Conventionally, various layout (involving wiring lines) design methods have been proposed as to semiconductor integrated circuits where cores are arranged in semiconductor chips.

In this specification, a "core" implies a large-scaled functional block capable of realizing a complex operation function by combining basic functional blocks such as an inverter, an AND gate circuit, and an OR gate circuit, used in an ASIC (Application Specified Integrated Circuit). A so-called "core" is designed by a primitive cell combination made of a functional cell and a plurality of functional cells.

As indicated in FIG. 1, a core 20 and another core 21 are arranged as a portion of structural elements on an upper surface of a semiconductor chip 19. A core wiring line 22 and another core wiring line 23 are formed inside the respective core 20 and core 21.

As previously described, in this semiconductor chip 19, it is prohibited that a semiconductor chip wiring line 24 passes through regions of these cores 20 and 21. As a consequence, this chip wiring line 24 passes through a boundary region Rk between these adjoining cores 20 and 21. The chip wiring lines 24 are collectively arranged in this boundary region Rk.

In this case that both the core 20 and the core 21 are arranged adjacent to each other, as explained before, the interval for separately arranging these cores 20 and 21 must be largely extended in view of the layout design in order that these chip wiring lines 24 may pass through the boundary region Rk under normal arranging condition. As a result, there is a problem that this arranging interval must be extended greater than the area of the semiconductor chip.

It should be noted that this conventional wiring method does not disclose a flow chart for explaining this wiring method.

Next, referring now to FIG. 2A to FIG. 2F, second related art will be described.

As apparent from these drawings, different from the above-described first related art, in this second related art, it may be allowed that a semiconductor chip wiring line passes through a region of a core.

FIG. 2A is a flow chart for representing the wiring method of the semiconductor integrated circuit according to this second related art.

FIGS. 2B, 2C, 2D, 2E and 2F are schematic chip layout diagrams for showing cores/chips corresponding to the respective wiring steps shown in FIG. 4A, and are illustrated at right-sided positions of the respective steps corresponding to the above-described flow chart process of FIG. 4A.

As apparent from FIG. 2A, the layout designing method of this second related art is constituted of a core designing flow step 401 and a chip designing flow step 402.

Concretely speaking, this core designing flow step 401 contains a core layout step 401-1, and a core operation checking step 401-2.

Also, the chip designing step 402 contains a core arranging step 402-1, a chip layout step 402-2, and a chip operation checking step 402-3.

More specifically, FIG. 2B is a schematic diagram for showing a layout state corresponding to the core layout step 401-1. FIG. 2C is a schematic diagram for showing a layout state corresponding to the core operation checking step 401-2. FIG. 2D is a schematic diagram for indicating a layout state corresponding to the core arranging step 402-1. FIG. 4D is a schematic diagram for showing a layout state corresponding to the chip layout step 402-2. Then, FIG. 2F is a schematic diagram for indicating a layout state corresponding to the chip operation checking step 402-3.

Referring now to FIG. 2A to FIG. 2F, the above-explained steps will be explained.

In the core layout designing step 401-1, a layout of a core 25 on a semiconductor chip is firstly designed. Then, in this step 401-1, a core wiring line (pattern) 26 is arranged, and this core wiring line 26 is required to realize the function of this core 25. Under this state, this core wiring line 26 is present on the core 25 (see schematic layout diagram of FIG. 2B).

Then, in the core operation checking step 401-2, an operation of the core 25 is checked based upon the wiring load capacitance value of the core wiring line 26 calculated in the core layout step 401-1 (see schematic layout diagram of FIG. 2C).

Next, in the core arranging step 402-1, the layout arrangement of the core 25, the operation of which has been checked, is carried out with respect to the semiconductor chip 27 (refer to the schematic layout diagram of FIG. 2D.)

Next, in the chip layout step 402-2, a chip wiring line 28 required to realize the function of the chip 27 is formed. In this second related art, this chip wiring line 28 may pass through the region of the core 25. As a consequence, the chip wiring line 28 is formed while passing through the internal region of the core 25, if required (refer to the schematic layout diagram of FIG. 2E).

Then, in the chip operation checking step 402-3, the operation of the chip 27 on which the chip wiring line 28 has been formed in the chip layout stage 402-2 is carried out (refer to the schematic layout diagram of FIG. 2F).

Referring now to FIG. 3, third related art will be explained.

FIG. 3 schematically shows a layout example of a semiconductor chip 29 in the third related art. In this semiconductor chip 29, a core 30 and another core 31 are arranged.

In this third related art, both a core wiring line 32 specific to the core 30 and another core wiring line 33 specific to the core 31 are arranged within the respective regions of the core 30 and the core 31. Within the regions of these cores 30 and 31, both a channel 35 and another channel 36 are previously formed, through which 3 sets of chip wiring lines 34 formed on the semiconductor chip 29 are branched, and the branched chip wiring lines 34 may pass. It should be understood that there is no flow chart for explaining the wiring method of this third related art similar to the first related art.

The above-described conventional semiconductor integrated circuits and also wiring methods thereof realized by the first to third related art own the following problems:

That is, in the wiring method of the first related art, it is prohibited that the chip wiring line passes through the region of the core on the semiconductor chip. As a consequence when a plurality of cores are arranged on the chip, as indicated in FIG. 1, the layout is made by that the chip wiring lines are collectively formed in the boundary region between the cores. In the case that the interval between these cores is narrow, it is practically impossible to arrange these chip wiring lines in this narrow boundary region. To avoid this problem, this narrow interval must be widened and further the chip area must be furthermore enlarged. As a consequence, the entire area occupied by the semiconductor chip would be necessarily increased.

In the second related art, the chip wiring line may pass through the region of the core. However, as represented in FIG. 2E, the wiring load capacitance caused by the chip wiring line 28 is added to the core wiring line 26. Since this wiring load capacitance is added, the signal transfer time within the core wiring line 26 inside the core 25 would be varied. In the core operation checking step 401-2, this operation checking action is carried out without considering the adverse influence caused by the wiring load capacitance by the chip wiring line 28. As a result, since this wiring load capacitance is added, there is such a risk that the logic operation executed in the chip operation checking step 402-3 may be different from that executed in the core operation checking step 401-2.

In particular, in such a case that a higher operating frequency is required for a core and higher precision in time delays within this core is needed, another risk would occur. That is to say, although devices provided in this core can be operated under normal condition during operation checking action by simulation, actual devices provided in this core would be erroneously operated.

To avoid this problem, either the capacitance between adjoining signal lines or the capacitance of interlayer wiring lines may be precisely extracted, depending upon the wiring conditions. However, this extracting method would require excessively large execution time so as to extract these wiring line capacitances.

Furthermore, in the wiring method of the third related art, as illustrated in FIG. 3, the channel must be previously formed within the core region. This channel is exclusively used to cause the chip wiring line to pass through this channel. This would increase the area required to form the core in correspondence with the channel occupied area. As a result, the area of the semiconductor chip would be increased.

Also, in the third related art, the effects expected for this channel could not be sufficiently obtained, depending upon the arranging direction of the core, or the arranging position of the channel, and the total number of the channels. Accordingly, the wiring function characteristic of the semiconductor chip would be deteriorated.

Japanese Laid Open Patent Application (JP-A-Heisei 7-153844) describes the technique that since the dummy wiring line is provided on such wiring lines with low density, positioned at the peripheral portion of the chip, this wiring line portion with the dummy wiring line may be similar to other wiring line portions with high density, positioned at the center portion of this chip. This conventional technique could equalize the wiring capacitances on the chip, so that the estimation precision of the wiring delay time could be improved.

However, this conventional technique cannot solve the above-explained problems.

Also, Japanese Laid Open Patent Application (JP-A-Heisei 7-175832) describes the below-mentioned CAD apparatus for designing semiconductor integrated circuits. In this CAD apparatus, the provisional arranging/wiring operations are carried out every layer block with respect to the logic circuits inputted to each of these layer blocks. Based upon these provisional arranging/wiring operations, the wiring capacitance values of the relevant wiring lines are calculated based on the lengths of the relevant wiring lines.

However, this conventional CAD apparatus cannot solve these problems.

Furthermore, Japanese Laid Open Patent Application (JP-A-Heisei 9-153550) discloses the following pattern generating method. In this pattern generating method, while the uniform dummy patterns having the sufficient covering rate are generated without any error, deterioration of the semiconductor device caused by increasing of the wiring capacitances can be simply predicted.

However, this conventional pattern generating method cannot solve the abovedescribed problems.

The present invention has been made to solve the above-explained problems, and therefore, has an object to provide a semiconductor device arranging/wiring method and also a semiconductor device arranging/wiring apparatus, capable of preventing erroneous operations of actual devices.

Furthermore, the present invention has another object to provide a semiconductor device arranging/wiring method and also a semiconductor device arranging/wiring apparatus, capable of reducing a size of a semiconductor device.

SUMMARY OF THE INVENTION

The present invention has been made to solve the above-described problems of the conventional arranging/wiring method of a semiconductor device. That is, this arranging/wiring method of a semiconductor device is capable of preventing erroneous operation of actual device, while reducing chip size.

In order to achieve an aspect of the present invention, a method of arranging/wiring a core used to constitute a semiconductor device on a semiconductor chip includes providing a core, arranging a core wiring line on the core, performing a core operation check to the core on which the core wiring line is arranged, arranging the core to which the core operation check has been performed, on a semiconductor chip to produce an arranged core, making a first wiring line capacitance of the core wiring line of the arranged core equal to a second wiring line capacitance of the core wiring line of the core when the core operation check of the core is performed and performing a chip operation check to the semiconductor chip on which the arranged core is arranged under a condition that the first wiring line capacitance is equal to the second wiring line capacitance.

In this case, the performing the core operation check of the core includes arranging a first dummy wiring line on the core such that the core wiring line of the core has a maximum wiring line capacitance between the first dummy wiring line and the core wiring line, calculating a value of a wiring line capacitance of the core wiring line when the first dummy wiring line is arranged; and performing the core operation check based on the calculated wiring line capacitance value, and wherein the making the first wiring line capacitance equal to the second wiring line capacitance includes arranging a chip wiring line on the semiconductor chip on which the arranged core is arranged to produce an arranged chip and arranging a second dummy wiring line on the arranged core of the arranged chip at a portion where the chip wiring line is not arranged, of a portion where the first dummy wiring line is arranged.

Also in this case, the performing the chip operation check of the semiconductor chip includes calculating a value of a second wiring line capacitance of the core wiring line when the second dummy wiring line is arranged and performing the chip operation check of the semiconductor chip based on the value of the calculated second wiring line capacitance.

Further in this case, the arranging the first dummy wiring line includes arranging the first dummy wiring line on the core at a portion close to the core wiring line such that the first dummy wiring line has a substantially same length at least as that of the core wiring line along the core wiring line.

In order to achieve another aspect of the present invention, the arranging the chip wiring line includes arranging the chip wiring line under a condition that the chip wiring line can pass through a substantially entire portion of the core.

In this case, the calculating the value of the wiring line capacitance includes calculating a value of parasitic capacitance per unit length, produced when a wiring line is arranged adjacent to the core wiring line and calculating the value of the wiring line capacitance based on the calculated parasitic capacitance per unit length, a length of the core wiring line, and a length of the first dummy wiring line.

Also in this case, the arranging the first dummy wiring line on the core includes arranging the first dummy wiring line on a first layer different from a second layer on which the core wiring line is arranged, and wherein the calculating the value of the wiring line capacitance includes calculating a value of an interlayer wiring line parasitic capacitance per unit length, produced when a wiring line is arranged on the first layer and calculating the value of the wiring line capacitance based on the calculated interlayer wiring line parasitic capacitance per unit length, a length of the core wiring line, and a length of the first dummy wiring line.

Further in this case, the calculating the value of the wiring line capacitance includes calculating the value of the wiring line capacitance under a condition that a potential of the first dummy wiring line is fixed to one of a ground potential and a predetermined potential.

In order to achieve still another aspect of the present invention, the providing the core includes providing the core constituted of a plurality of blocks and wherein the making the first wiring line capacitance equal to the second wiring line capacitance includes making the first wiring line capacitance equal to the second wiring line capacitance with respect to at least one block selected from the plurality of blocks of the core.

In this case, the providing the core includes providing the core constituted of a plurality of blocks and wherein the arranging the chip wiring line includes arranging the chip wiring line on a first block of the plurality of blocks under a condition that the chip wiring line can pass through a substantially entire portion of the first block and arranging the chip wiring line on a second block of the plurality of blocks under a condition that the chip wiring line is prohibited to pass through the second block.

Also in this case, arranging the first dummy wiring line on the core includes arranging the first dummy wiring line on the selected block without arranging the first dummy wiring line on at least one block other than the selected block of the plurality of blocks.

Further in this case, each of the selected block and the block other than the selected block has a circuit characteristic different from each other.

In order to achieve yet still another aspect of the present invention, a semiconductor device arranging/wiring apparatus for arranging/wiring a core used to constitute a semiconductor device on a semiconductor chip, includes a section for providing a core, a section for arranging a core wiring line on the core, a section for performing a core operation check to the core on which the core wiring line is arranged, a section for arranging the core to which the core operation check has been performed, on a semiconductor chip to produce an arranged core, a section for making a first wiring line capacitance of the core wiring line of the arranged core equal to a second wiring line capacitance of the core wiring line of the core when the core operation check of the core is performed and a section for performing a chip operation check to the semiconductor chip on which the arranged core is arranged under a condition that the first wiring line capacitance is equal to the second wiring line capacitance.

In this case, the section for performing the core operation check of the core includes a section for arranging a first dummy wiring line on the core such that the core wiring line of the core has a maximum wiring line capacitance between the first dummy wiring line and the core wiring line, a section for calculating a value of a wiring line capacitance of the core wiring line when the first dummy wiring line is arranged and a section for performing the core operation check based on the calculated wiring line capacitance value, and wherein the section for making the first wiring line capacitance equal to the second wiring line capacitance includes section for arranging a chip wiring line on the semiconductor chip on which the arranged core is arranged to produce an arranged chip and a section for arranging a second dummy wiring line on the arranged core of the arranged chip at a portion where the chip wiring line is not arranged, of a portion where the first dummy wiring line is arranged.

Also in this case, the section for performing the chip operation check of the semiconductor chip includes a section for calculating a value of a second wiring line capacitance of the core wiring line when the second dummy wiring line is arranged and a section for performing the chip operation check of the semiconductor chip based on the value of the calculated second wiring line capacitance.

Further in this case, the section for arranging the first dummy wiring line includes a section for arranging the first dummy wiring line on the core at a portion close to the core wiring line such that the first dummy wiring line has a substantially same length at least as that of the core wiring line along the core wiring line.

In this case, the section for arranging the chip wiring line includes a section for arranging the chip wiring line under a condition that the chip wiring line can pass through a substantially entire portion of the core.

Also in this case, the section for calculating the value of the wiring line capacitance includes a section for calculating a value of parasitic capacitance per unit length, produced when a wiring line is arranged adjacent to the core wiring line and a section for calculating the value of the wiring line capacitance based on the calculated parasitic capacitance per unit length, a length of the core wiring line, and a length of the first dummy wiring line.

Further in this case, the section for arranging the first dummy wiring line on the core includes section for arranging the first dummy wiring line on a first layer different from a second layer on which the core wiring line is arranged, and wherein the section for calculating the value of the wiring line capacitance includes a section for calculating a value of an interlayer wiring line parasitic capacitance per unit length, produced when a wiring line is arranged on the first layer and a section for calculating the value of the wiring line capacitance based on the calculated interlayer wiring line parasitic capacitance per unit length, a length of the core wiring line, and a length of the first dummy wiring line.

In this case, the section for calculating the value of the wiring line capacitance includes section for calculating the value of the wiring line capacitance under a condition that a potential of the first dummy wiring line is fixed to one of a ground potential and a predetermined potential.

Also in this case, the section for providing the core includes section for providing the core constituted of a plurality of blocks and wherein the section for making the first wiring line capacitance equal to the second wiring line capacitance includes section for making the first wiring line capacitance equal to the second wiring line capacitance with respect to at least one block selected from the plurality of blocks of the core.

Further in this case, the section for providing the core includes section for providing the core constituted of a plurality of blocks and wherein the section for arranging the chip wiring line includes a section for arranging the chip wiring line on a first block of the plurality of blocks under a condition that the chip wiring line can pass through a substantially entire portion of the first block and a section for arranging the chip wiring line on a second block of the plurality of blocks under a condition that the chip wiring line is prohibited to pass through the second block.

In this case, the section for arranging the first dummy wiring line on the core includes section for arranging the first dummy wiring line on the selected block without arranging the first dummy wiring line on at least one block other than the selected block of the plurality of blocks.

Also in this case, each of the selected block and the block other than the selected block has a circuit characteristic different from each other.

BRIEF DESCRIPTION OF THE DRAWINGS

A more complete understanding of the teachings of the present invention may be acquired by referring to the accompanying figures, in which like reference numbers indicate like features and wherein:

FIG. 2A is a flow chart for describing the layout designing method of the second related art;

FIG. 2B is a schematic diagram for indicating the layout condition corresponding to the core layout step of the second related art;

FIG. 2C is a schematic diagram for showing the layout state corresponding to the core operation checking step of the second related art;

FIG. 2D is a schematic diagram for representing the layout state corresponding to the core arranging step of the second related art;

FIG. 2E is a schematic diagram for showing the chip layout step of the second related art;

FIG. 2F is a schematic diagram for indicating the layout state corresponding to the chip operation checking step of the second related art;

DESCRIPTION OF THE PREFERRED EMBODIMENTS

Referring now to drawings, various preferred embodiments according to the present invention will be described in detail.

FIRST LAYOUT DESIGNING METHOD

Figure 1:
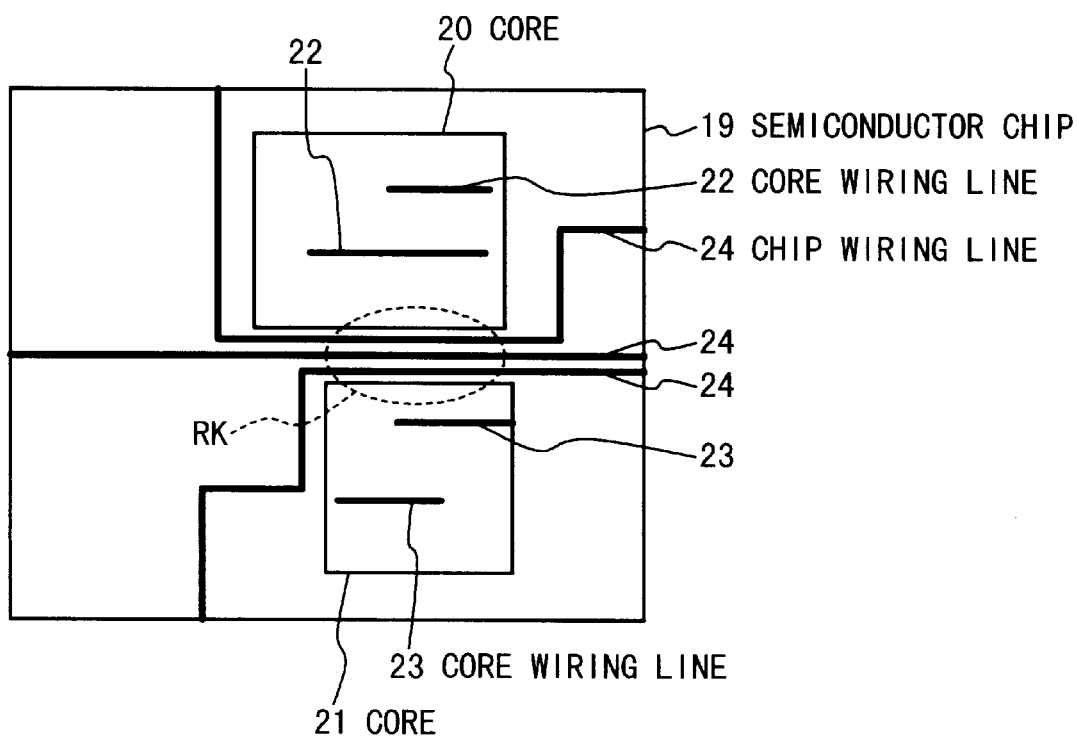
FIG. 1 schematically shows the layout diagram of the core in the first related art.
Figure 3:
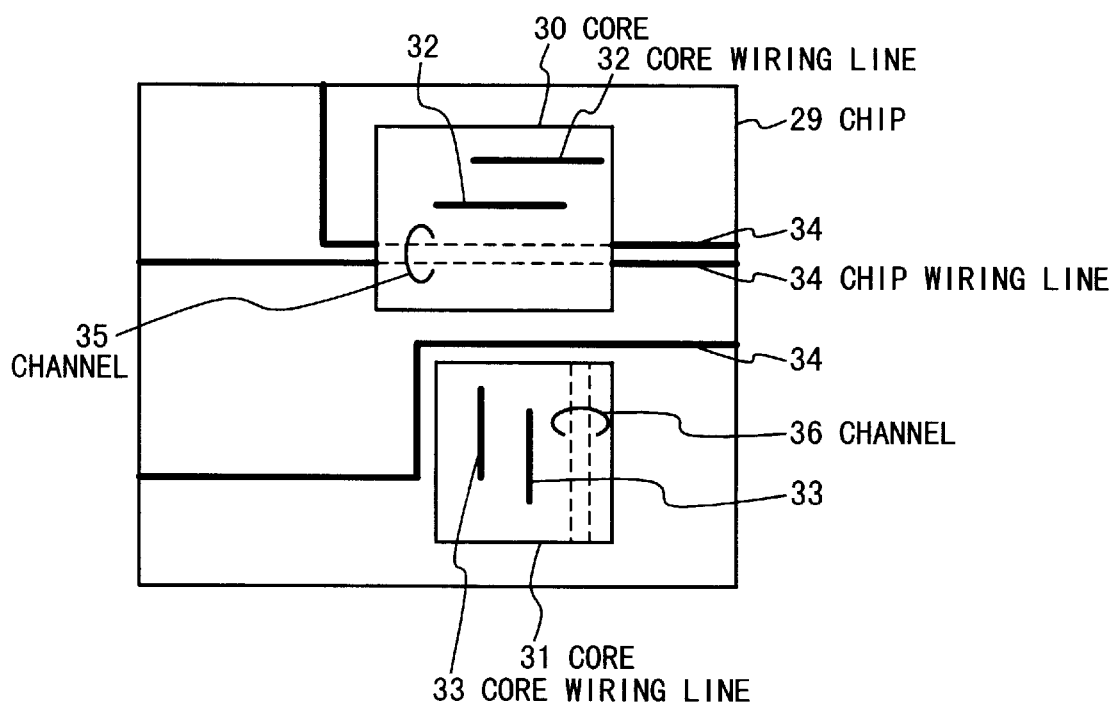
FIG. 3 indicates the layout diagram of the core in the third related art.
Figure 4A:
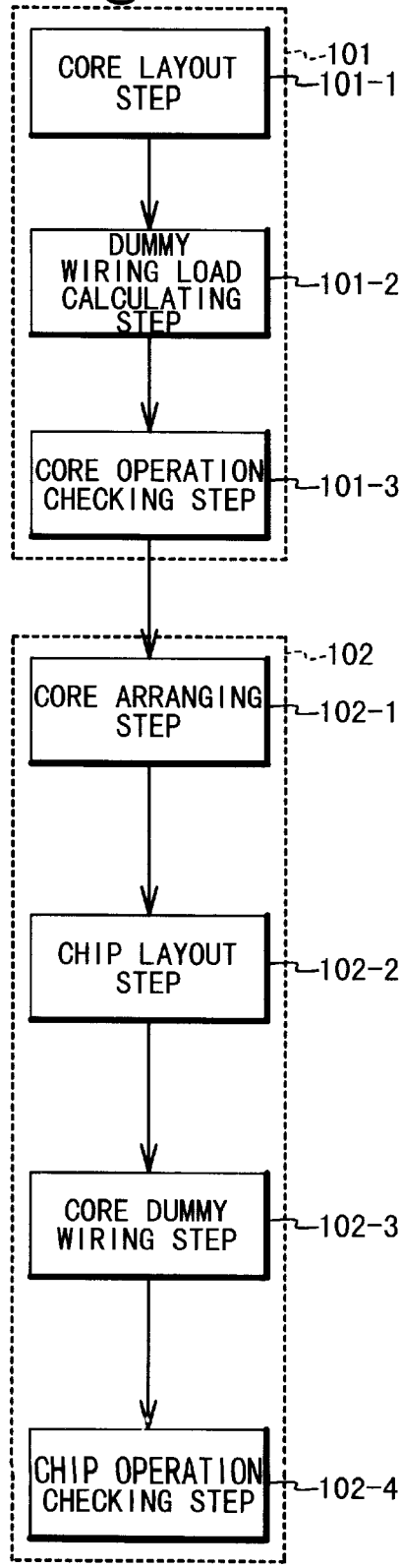
FIG. 4A is a flow chart for describing a layout designing method according to a first embodiment of the present invention.

FIG. 4A is a flow chart for explaining a layout designing (wiring) method according to a first embodiment of the present invention.

As apparent from this flow chart, the layout designing method of this first embodiment according to the present invention is constituted of a core designing flow step 101 and a chip designing flow step 102.

Concretely speaking, this core designing flow step 101 contains a core layout step 101-1, a dummy wiring load calculating step 101-2, and a core operation checking step 101-3.

Also, the chip designing step 102 contains a core arranging step 102-1, a chip layout step 102-2, a core dummy wiring step 102-3, and a chip operation checking step 102-4.

FIGS. 4B, 4C, 4D, 4E, 4F, 4G and 4H are schematic layout diagrams for showing cores/chips corresponding to the respective wiring steps shown in FIG. 4A, and are illustrated at rightsided positions of the respective steps corresponding to the above-described flow chart process of FIG. 4A.

Figure 4B:
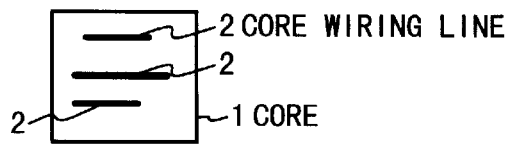
FIG. 4B is a schematic diagram for showing a layout state corresponding to a core layout step of the first embodiment.
Figure 4C:
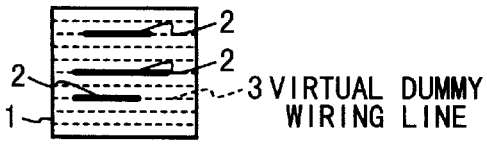
FIG. 4C is a schematic diagram for representing a layout state corresponding to a dummy wiring load calculating step of the first embodiment.
Figure 4D:
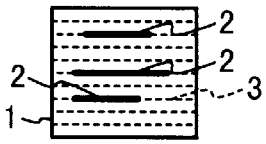
FIG. 4D is a schematic diagram for showing a layout state corresponding to a core operation checking step of the first embodiment.
Figure 4E:
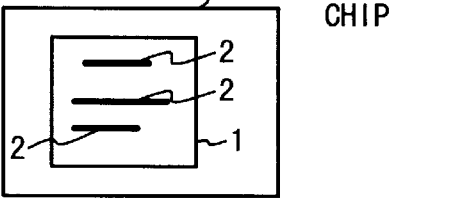
FIG. 4E is a schematic diagram for indicating a layout state corresponding to a core arranging step of the first embodiment.
Figure 4F:
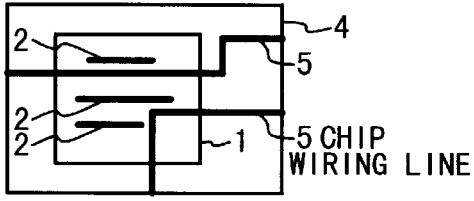
FIG. 4F is a schematic diagram for showing a layout state corresponding to a chip layout step of the first embodiment.
Figure 4G:
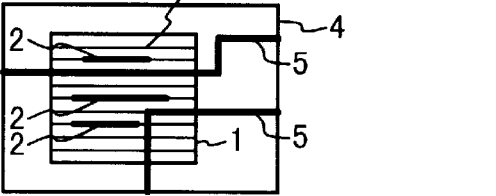
FIG. 4G is a schematic diagram for representing a layout state corresponding to a core dummy wiring step of the first embodiment.
Figure 4H:
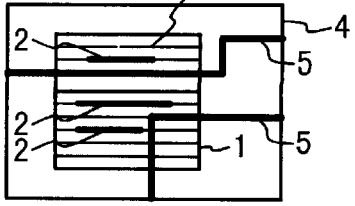
FIG. 4H is a schematic diagram for indicating a layout state corresponding to a chip operation checking step of the first embodiment.

More specifically, FIG. 4B is a schematic diagram for showing a layout state corresponding to the core layout step 101-1. FIG. 4C is a schematic diagram for representing a layout state corresponding to the dummy wiring load calculating step 101-2. FIG. 4D is a schematic diagram for showing a layout state corresponding to the core operation checking step 101-3. FIG. 4E is a schematic diagram for indicating a layout state corresponding to the core arranging step 102-1. FIG. 4F is a schematic diagram for showing a layout state corresponding to the chip layout step 102-2. FIG. 4G is a schematic diagram for representing a layout state corresponding to the core dummy wiring step 102-3. Then, FIG. 4H is a schematic diagram for indicating a layout state corresponding to the chip operation checking step 102-4.

In the core designing flow step 101, a layout of a core 1 on a semiconductor chip is firstly designed in the core layout step 101-1. Then, in this step 101-1, a core wiring line (pattern) 2 is arranged, and this core wiring line 2 is required to realize the function of this core 1. As previously described, a term "core" implies a large-scaled functional block capable of realizing a complex operation function by combining basic functional blocks such as an inverter, and AND gate circuit, and an OR gate circuit, used in an ASIC (Application Specified Integrated Circuit).

Under this state, only this core wiring line 2 is present on the core 1 (see schematic layout diagram of FIG. 4B).

Next, assuming now that a wiring line, or a wiring pattern is present in a wiring available region within the region of this core 1 in the dummy wiring load calculating step 101-2, a virtual dummy wiring line 3 (corresponding to the wiring line, or the wiring pattern) is additionally provided with this core 1. The core wiring line 2 originally has a wiring load capacitance between a bottom surface and the own core wiring line 2. In this step, since the above-explained virtual dummy wiring line 3 is added to the core 1, another capacitance is additionally provided in addition to the above-described original wiring load capacitance defined between the bottom surface and the core wiring line 2. This additional capacitance is equivalent to a load capacitance between adjoining wiring lines, namely between the core wiring line 2 and the virtual dummy wiring line 3 (see schematic layout diagram of FIG. 4C).

At this time, the virtual dummy wiring line 3 is added in the below-mentioned manner. That is, this virtual dummy wiring line 3 is additionally provided such that the core wiring line 2 which has already been arranged in the previous core layout step 101-1 has a maximum wiring load capacitance within respect to the virtual dummy wiring line 3. In other words, in order that this core wiring line 2 may have the maximum wiring load capacitance, the virtual wiring line 3 may be formed at a position close to the core wiring line 2, and along the core wiring line 2 over the entire portion of this core wiring line 2.

As illustrated in FIG. 4C, the virtual dummy wiring line 3 are provided with a constant interval, and are positioned in parallel to the straight-shaped core wiring line 2, and also have lengths equal to the entire transverse width of the core 1. It should be understood that the arrangement of this virtual dummy wiring line 3 is not limited to that shown in FIG. 4C.

Figure 5A:
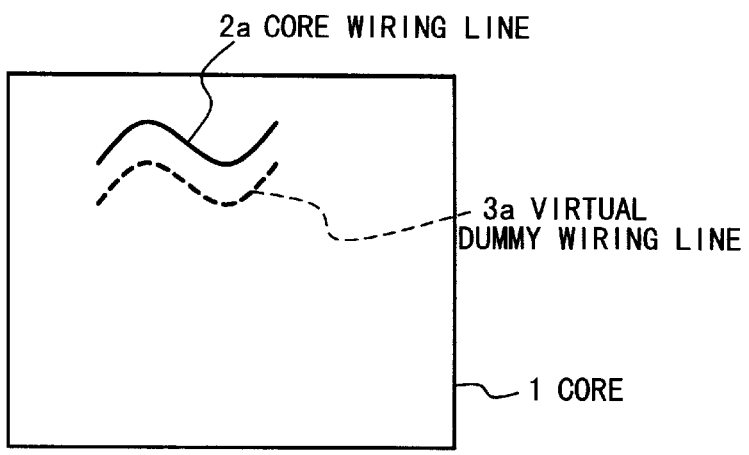
FIG. 5A is a schematic diagram for indicating an example of a virtual dummy wiring arrangement in the dummy wiring load calculating step of the first embodiment.

As illustrated in FIG. 5A, for instance, in the case that a core wiring line 2a is a curved line, a virtual dummy wiring line 3a is formed such that this virtual dummy wiring line 3a is located along this core wiring line 2a, namely the virtual dummy wiring line 3a may have the same curvature at that of the core wiring line 2a.

Figure 5B:
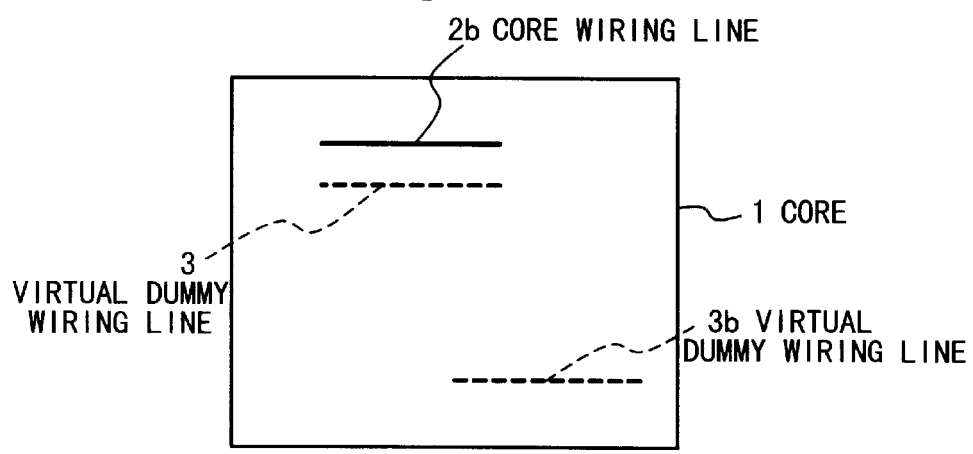
FIG. 5B is a schematic diagram for showing another example of a virtual dummy wiring arrangement in the dummy wiring load calculating step of the first embodiment.

Also, since the virtual dummy wiring line 3 may be formed such that the core wiring line 2 may have the above-explained maximum wiring line load capacitance, as illustrated in FIG. 5B, a virtual dummy wiring line 3b is no longer formed at a position apart from the core wiring line 2b, where a wiring load capacitance is not given to this core wiring line 2b.

Figure 5C:
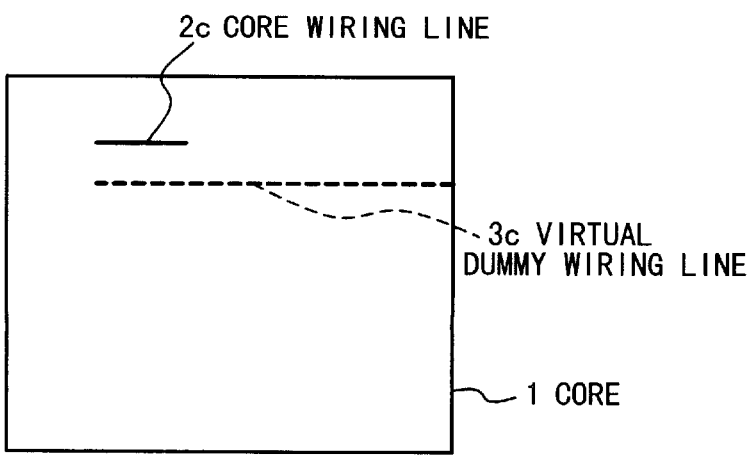
FIG. 5C is a schematic diagram for showing another example of a virtual dummy wiring arrangement in the dummy wiring load calculating step of the first embodiment.

Also, as represented in FIG. 5C, in a case that a core wiring line 2c is short, there is no necessity to form a virtual dummy wiring line 3c such that a length of the formed virtual dummy wiring line 3c is longer than it needs to give a wiring load capacitance to the short core wiring line 2c. In other words, this virtual dummy wiring line may sufficiently have a length substantially equal to the length of the core wiring line 2c.

As a consequence, in the dummy wiring load calculating step 101-2, the above-described maximum wiring load capacitance is calculated. The maximum wiring load capacitance is possibly owned by the core wiring line 2 and corresponds to the maximum value given by an arranged chip wiring line 5 when the chip wiring line 5 is arranged in the subsequent chip layout step 102-2, irrespective of the arranging manner of this chip wiring line 5 (namely, irrespective of a fact that how the chip wiring line 5 is arranged with respect to the core wiring line 2).

In this dummy wiring load calculating step 101-2, a parasitic capacitance value between adjoining wiring lines per unit length is previously calculated such that adjoining wiring lines are arranged on both sides of a wiring line. Based upon this calculated parasitic capacitance value between the adjoining wiring lines per unit length, the length of the core wiring line 2, and also the length of the virtual dummy wiring line 3, a calculation is made of a capacitance value (namely, the above-described added value) equivalent to a load capacitance between adjoining lines with respect to the core wiring line 2 and the virtual dummy wiring line 3.

Also, as an arranging position of the virtual dummy wiring line 3, the virtual dummy wiring line 3 and the core wiring line 2 are preferable set to isolated positions from each other to avoid that the virtual dummy wiring line 3 is shortcircuited with the core wiring line 2.

To stabilize a potential, the virtual dummy wiring line 3 is preferable calculated under a condition that a potential of the virtual dummy wiring line 3 is fixed to either the ground potential or a predetermined power supply potential.

Furthermore, in FIG. 4A to FIG. 4H, the layout designing method according to the first embodiment has been explained only on the two-dimensional single plane. Apparently, this layout designing method may be similarly applied to the respective wiring line layers which constitute an ASIC chip. As a result, in this dummy wiring load calculating step 101-2, in addition to the parasitic capacitance between adjoining wiring lines, a parasitic capacitance of interlayer wiring lines may be added to the calculated dummy wiring load. It should also be noted that this method for arranging the virtual dummy wiring line 3 in this three-dimensional case may be similarly applied to the two-dimensional cases as explained with respect to FIG. 5A, FIG. 5B, and FIG. 5C.

The above-described "adjoining-line parasitic capacitance" is equal to a parasitic capacitance existed between the two virtual dummy wiring lines 3, 3 which are arranged on both sides of the core wiring line 2.

Also the above-explained "interlayer-line parasitic capacitance" is equal to a parasitic capacitance between the core wiring line 2 and a core wiring line or a virtual dummy wiring line, which is located in the upper/lower wiring line layers other than the layer in which the core wiring line 2 is arranged.

Then, in the core operation checking step 101-3, an operation of the core 1 is checked based upon the wiring load capacitance value calculated in the dummy wiring load calculating step 101-2. This wiring load capacitance value implies the above-explained maximum wiring load capacitance which is possibly owned by the core wiring line 2 (see schematic layout diagram of FIG. 4D, namely the layout diagram of FIG. 4D is identical to the layout diagram of FIG. 4C).

CHIP DESIGNING FLOW STEP

Next, the chip design flow step 102 will now be explained more in detail.

In this core arranging step 102-1, the layout arrangement of the core 1 to a semiconductor chip 4 is performed (refer to the schematic layout diagram of FIG. 4E.). In the core arranging step 102-1, the core 1 has been designed in the core designing flow step 101.

In general, an arranging direction of a core and an arranging available portion of this core are restricted by an automatic wiring tool and the like. To the contrary, the first embodiment is performed in the condition that there is no such a limitation. In other words, in the above-described conventional method for providing the channel specific to the penetrating of the chip wiring line in the third related art, both the arranging direction of the core 30, 31 and the arranging available position thereof are limited. To the contrary, in the first embodiment, since the chip wiring line 5 can be penetrated through the substantially entire portion of the core 1, the above-described limitation is not applied thereto.

Next, in the chip layout step 102-2, the chip wiring line 5 required to realize the function of the chip 4 is formed. In this case, this chip wiring line 5 may pass through the substantially entire portion of the core 1 (refer to the schematic layout diagram shown in FIG. 4F).

Thereafter, since the arrangement of this chip wiring line 5 is accomplished, a dummy wiring line 6 is formed in the core/dummy wiring step 102-3 (refer to the schematic layout diagram indicated in FIG. 4G).

In this core/dummy wiring step 102-3, when a wiring available portion other than the portion where the chip wiring line 5 is formed within the core 1 is left, dummy wiring lines 6 are formed on all of the remaining portion. In this case, these dummy wiring lines 6 are arranged on all of the positions where the virtual dummy wiring line 3 is formed, but the chip wiring line 5 is not formed.

Similar to the above-described condition of the dummy wiring load calculating step 101-2, this dummy wiring line 6 is preferably set to a state that the potential of the dummy wiring line 6 is fixed to either the ground potential or a predetermined potential of the power supply voltage to stabilize the potential. Furthermore, the following shortcircuit condition must be avoided. That is, the dummy wiring line 6 is shortcircuited to the chip wiring line 5.

Then, after the process operation of this core/dummy wiring step 102-3 is accomplished, a wiring load capacitance is calculated under a state that the dummy wiring line 6 is located in each of the wiring layers of the ASIC chip in the chip operation checking step 102-4. Based upon this calculated wiring load capacitance, the chip operation check is performed to confirm the operation of the chip 4.

It should be noted that the wiring load capacitance calculated in the chip operation checking step 102-4 is equal to the above-explained maximum wiring load capacitance which is calculated in the dummy wiring load calculating step 101-2. In other words, the wiring load capacitance calculated in the chip operation checking step 102-4 is equal to a wiring load capacitance when the operation of the core 1 is checked in the core operation checking step 101-3. The reason is given as follows. That is, the wiring load capacitance calculated in the chip operation checking step 102-4 is continuously made equal to the above-explained maximum wiring load capacitance. The wiring load capacitance calculated in the chip operation checking step 102-4 is calculated on the assumption that the dummy wiring line 6 arranged in the position equal to the position of the virtual dummy wiring line 3, is present in addition to the actually arranged chip wiring line 5.

As a consequence, even when the chip wiring line 5 is arranged at any positions with respect to the core wiring line 2 in the chip layout step 102-2, there is no risk that the logic operation different from the logic operation obtained as the result of the core operation checking step 101-3, does not occur in the chip operation checking step 102-4.

As previously described in detail, in accordance with the first embodiment, the wiring method includes the dummy wiring load calculating step 101-2 in the core designing flow step 101, and the core/dummy wiring step 102-3 in the chip designing flow step 102.

As a result, the wiring load capacitance of the core 1 calculated when the operation of the core 1 is checked (step 101-3) can be made equal to the wiring load capacitance of the core 1 calculated when the operation of the chip is checked (step 102-4), namely, equal to the maximum wiring load capacitance. As a consequence, it is possible to prevent the actual device from being erroneously operated based on the variation of the wiring load capacitance.

In accordance with the first embodiment, the chip wiring line 5 can be penetrated not through the passing wiring region which is previously formed in the core 1, but through the passing available region remained when the core 1 is designed, namely a region where the chip wiring line 5 is not shortcircuited to the core wiring line 2. Therefore, the wiring efficiency of the chip can be increased. Furthermore, in the first embodiment, no longer such a channel used to penetrate the chip wiring line through the core is required. As a consequence, the area occupied by the core within the entire chip can be reduced.

SECOND LAYOUT DESIGNING METHOD

Next, a description will now be made of a layout designing method according to a second embodiment of the present invention.

Figure 6:
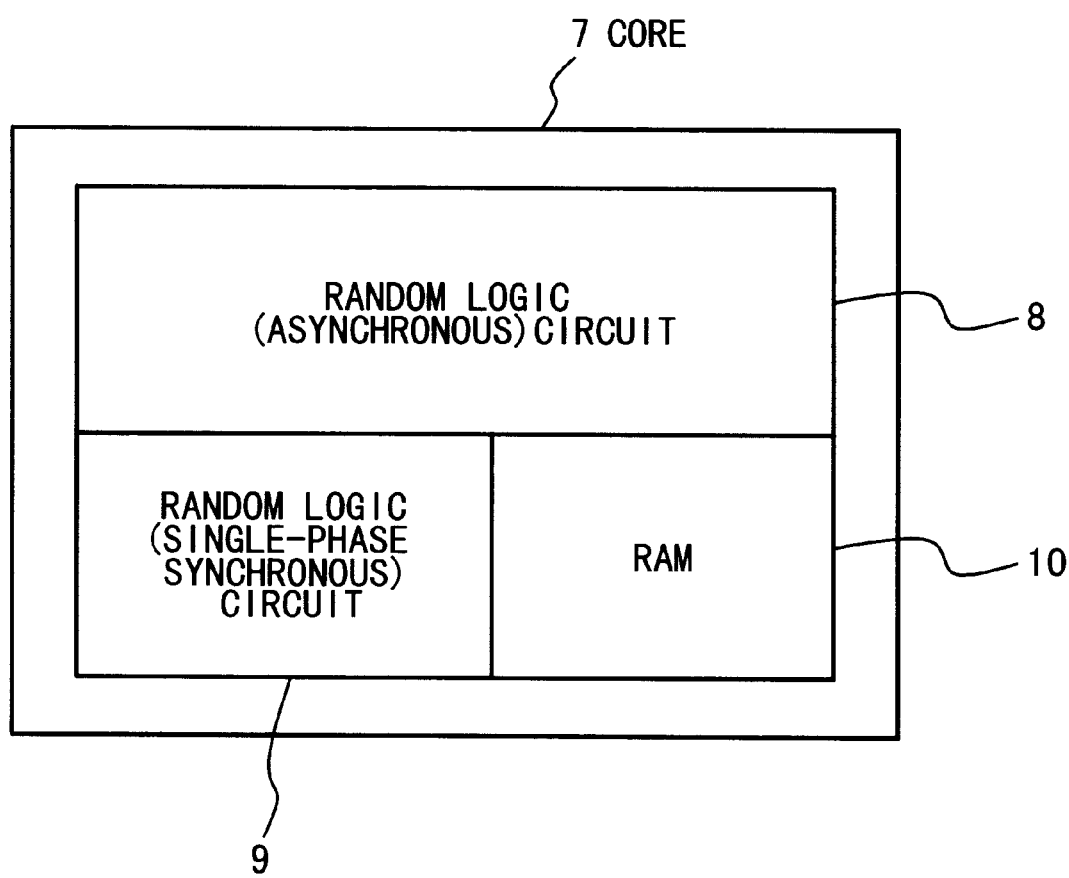
FIG. 6 is a layout diagram for indicating a core to which a second embodiment of the present invention is applied.

FIG. 6 schematically indicates a layout of a so-called "core" 7, designed by the layout designing method of the second embodiment. As indicated in FIG. 6, this core 7 is constituted of a random logic (asynchronous) circuit 8, another random logic (single-phase synchronous) circuit 9, and a RAM (random access memory) 10.

The circuit characteristics of the random logic (asynchronous) circuit 8, the random logic (single-phase synchronous) circuit 9, and the RAM 10 are different from each other.

The random logic (asynchronous) circuit 8 has the timing-specific characteristic without emphasizing the operating speed. In contrast, the random logic (single-phase synchronous) circuit 9 has the characteristic without emphasizing both the operating speed and the timing. To the contrary, the RAM 10 has the characteristic with emphasizing both the operating speed and the timing.

In accordance with these circuit characteristics specific to these circuits 8, 9 and 10, the core 7 is arranged such that, as indicated in FIG. 6, these circuits 8, 9, and 10 are grouped.

This wiring (layout designing) method according to this second embodiment may be applied to the core having such a grouped circuit.

Figure 7A:
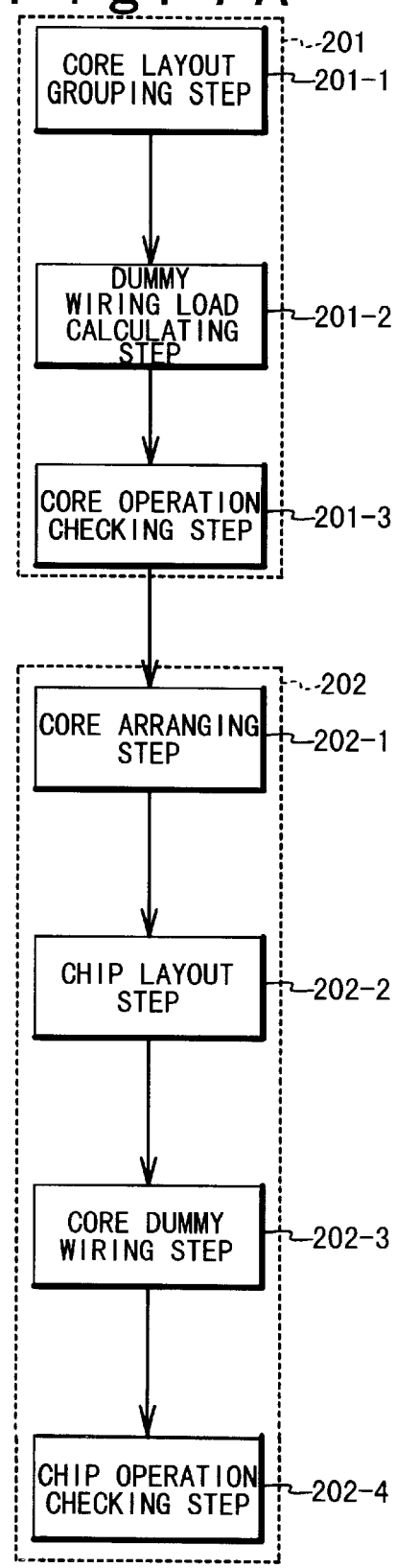
FIG. 7A is a flow chart for describing a layout designing method according to a second embodiment of the present invention.
Figure 7B:
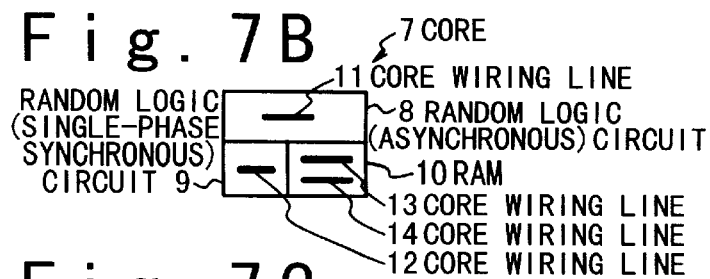
FIG. 7B is a schematic diagram for showing a layout state corresponding to the core layout grouping step of the second embodiment.

FIG. 7A is a flow chart for explaining a layout designing (wiring) method according to a second embodiment of the present invention.

As apparent from this flow chart, the layout designing method of this second embodiment is constituted of a core designing flow step 201 and a chip designing flow step 202.

Concretely speaking, this core designing flow step 201 contains a core layout grouping step 201-1, a dummy wiring load calculating step 201-2, and a core operation checking step 201-3.

Also, the chip designing flow step 202 contains a core arranging step 202-1, a chip layout step 202-2, a core dummy wiring step 202-3, and a chip operation checking step 202-4.

FIGS. 7B, 7C, 7D, 7E, 7F, 7G and 7H are schematic layout diagrams for showing cores/chips corresponding to the respective wiring steps shown in FIG. 7A, similar to the first embodiment, and are illustrated at right-sided positions of the respective steps corresponding to the above-described flow chart process of FIG. 7A.

First, the core designing step 201 will now be described.

In the core layout grouping step 201-1, the circuits having the different characteristics from each other are grouped to be arranged as shown in FIG. 6 in correspondence with the respective function. Also, in the core layout grouping step 201-1, core wiring lines 11, 12, 13 and 14 are set and arranged to realize the functions of the respective circuits 8, 9 and 10 (refer to the schematic layout diagram of FIG. 7B).

Subsequently, in the dummy wiring load calculating step 201-2, assuming now that a wiring line is present in a wiring available region of the random logic (asynchronous) circuit 8, a virtual dummy wiring line 15 is arranged as the assumed wiring line. The core wiring line 11 of the random logic (asynchronous) circuit 8 originally has a wiring load capacitance between a bottom surface and the own core wiring line 11. In this step, since the above-explained virtual dummy wiring line 15 is added, another capacitance is additionally provided in addition to the above-described original wiring load capacitance defined between the bottom surface and the core wiring line 11. This additional capacitance is equivalent to a load capacitance between adjoining wiring lines, namely between the wiring line 11 and the virtual dummy wiring line 15 (see the schematic layout diagram of FIG. 7C).

At this time, the virtual dummy wiring line 15 is added in the below-mentioned manner shown in FIG. 5. That is, this virtual dummy wiring line 15 is additionally provided such that the core wiring line 11 which has already been arranged in the previous core layout grouping step 201-1 has a maximum wiring load capacitance within respect to the virtual dummy wiring line 15. In other words, in order that this core wiring line 11 may have the maximum wiring load capacitance, the virtual wiring line 15 may be formed at a position close to the core wiring line 11, and along the wiring line 11 over the entire portion of this core wiring line 11.

In this dummy wiring load calculating step 201-2, a parasitic capacitance value between adjoining wiring lines per unit length is previously calculated such that adjoining wiring lines are arranged on both sides of a wiring line. Based upon this calculated parasitic capacitance value between the adjoining wiring lines per unit length, the length of the core wiring line 11, and also the length of the virtual dummy wiring line 15, a calculation is made of a capacitance value equivalent to a load capacitance between adjoining lines with respect to the core wiring line 11 and the virtual dummy wiring line 15.

Also, as another arranging position of the virtual dummy wiring line 15, the virtual dummy wiring line 15 and the core wiring line 11 are preferable set to isolated positions from each other, while avoiding that the virtual dummy wiring line 15 is shortcircuited with the core wiring line 11.

To stabilize a potential, the virtual dummy wiring line 15 is preferable calculated under such a condition that a potential of this virtual dummy wiring line 15 is fixed to either the ground potential or a predetermined power supply potential.

Furthermore, in FIG. 7A to FIG. 7H, the layout designing method according to the second embodiment has been explained only on the two-dimensional single plane. Apparently, this layout designing method may be similarly applied to the respective wiring line layers which constitute an ASIC chip. As a result, in this dummy wiring load calculating step 201-2, not only the parasitic capacitance between adjoining wiring lines, but also a parasitic capacitance of interlayer wiring lines may be added.

The above-described "adjoining-line parasitic capacitance" is equal to such a parasitic capacitance existed between the two virtual dummy wiring lines 15 which are arranged on both sides of the core wiring line 11.

Also the above-explained "interlayer-line parasitic capacitance" is equal to such a parasitic capacitance existed between a core wiring line and a virtual dummy wiring line, which are located in other wiring line layers arranged upper/lower the core wiring line 11.

It should be understood that in this dummy wiring load calculating step 201-2, as to other circuit regions, namely the random logic (single-phase synchronous) circuit 9 and the RAM 10, a wiring load capacitance is calculated under such a condition that there is no virtual dummy wiring line due to the below-mentioned reason.

As previously explained, this random logic (single-phase synchronous) circuit 9 has the characteristic without emphasizing both the operating speed and the timing. As a consequence, not-so-high precision of the signal transfer time is required for the core wiring line 12 provided within the random logic (single-phase synchronous) circuit 9 whose operating frequency is low. As a result, even when a chip wiring line 17 is arranged in a portion of the random logic (single-phase synchronous) circuit 9, and also the wiring load capacitance caused by the chip wiring line 17 is added to the core wiring line 12, there is no risk that different logic operations are performed both in the core operation checking step 201-3 which is executed without being influenced by the caused wiring load capacitance, and in the chip operation checking step 202-4 which is executed with being influenced by the caused wiring load capacitance.

On the other hand, as to the circuit region of the RAM 10, in the chip layout step 202-2, it is prohibited that the chip wiring line 17 passes through the RAM 10 due to the following reason. As a consequence, there is no need to add the virtual dummy wiring line to this RAM 10.

The RAM 10 has the characteristic for emphasizing the operation speed. Under such a circumstance, the below-mentioned signal transfer delay may conduct serious problems. This signal transfer delay is caused by the wiring load capacitance added to the core wiring lines 13 and 14 by the chip wiring line 17. Due to the above-explained reason, it is prohibited that the chip wiring line 17 may pass through the circuit region of the RAM 10.

Figure 7C:
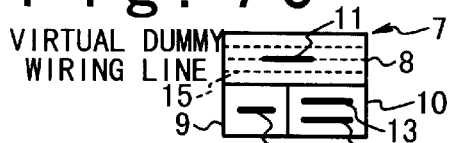
FIG. 7C is a schematic diagram for representing a layout state corresponding to a dummy wiring load calculating step of the second embodiment.
Figure 7D:
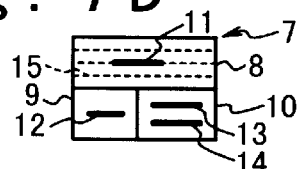
FIG. 7D is a schematic diagram for showing a layout state corresponding to a core operation checking step of the second embodiment.

Then, in the core operation checking step 201-3, the operation of the core 7 is checked based upon the wiring load capacitance obtained in the dummy wiring load calculating step 201-2 (refer to the schematic layout diagram of FIG. 7D, and note that FIG. 7D is identical to FIG. 7C).

CHIP DESIGNING FLOW STEP

Next, the chip design flow step 202 will now be explained more in detail.

Figure 7E:
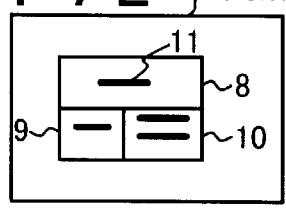
FIG. 7E is a schematic diagram for indicating a layout state corresponding to a core arranging step of the second embodiment.

In this core arranging step 202-1, the layout arrangement of the core 7 which has been designed in the core designing flow step 201 is carried out with respect to the semiconductor chip 16 (refer to the schematic layout diagram of FIG. 7E.)

In general, an arranging direction of a core and an arranging available region of this core are restricted by an automatic wiring tool and the like. However, in accordance with the advantage achieved by this second embodiment, such a limitation is not made when the core 7 is arranged/directed in/to the arranging available region. In other words, in the above-described conventional method for providing the channel specific to the penetrating of the chip wiring line in the third related art, both the arranging direction of the core 7 and the arranging available position thereof are limited. To the contrary, in the second embodiment, since the chip wiring line 17 can be penetrated through the region of the core 7, the above-described limitation is not applied thereto.

Next, in the chip layout step 202-2, the chip wiring line 17 required to realize the function of the chip 16 is formed.

Figure 7F:
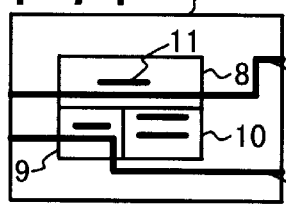
FIG. 7F is a schematic diagram for showing a layout state corresponding to a chip layout step of the second embodiment.

In this case, as previously explained, the chip wiring line 17 may be arranged in such a manner that this wiring line 17 passes through the circuit regions of the random logic (asynchronous) circuit 8 and the random logic (single-phase synchronous) circuit 9, but cannot pass through the circuit region of the RAM 10 (refer to the schematic layout diagram of FIG. 7F). As previously described, the RAM 10 owns the characteristic capable of emphasizing the operating speed. Therefore, the signal transfer delays induces the serious problem. The signal transfer delays are caused by the wiring line load capacitance by the chip wiring line 17, which is applied to the core wiring lines 13 and 14. As a consequence, it is so prohibited that this chip wiring line 17 passes through the RAM 10.

Figure 7G:
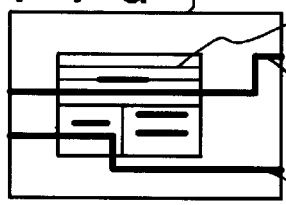
FIG. 7G is a schematic diagram for representing a layout state corresponding to a core dummy wiring step of the second embodiment.
Figure 7H:
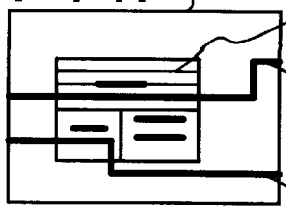
FIG. 7H is a schematic diagram for indicating a layout state corresponding to a chip operation checking step of the second embodiment.

Thereafter, since the arrangement of this chip wiring line 17 is accomplished, a dummy wiring line 18 is formed in the core/dummy wiring step 202-3 in the circuit region of the random logic circuit 8 (refer to the schematic layout diagram indicated in FIG. 7G). The reason why the dummy wiring line 18 is not formed within the circuit region of the random logic (single-phase synchronous) circuit 9 is similar to the above explained reason why the virtual dummy wiring line is not formed within the circuit region of the random logic (single-phase synchronous) circuit 9.

In this core/dummy wiring step 202-3, in such a case that a wiring available region other than the region where the chip wiring line 17 is formed within the circuit region of the random logic (asynchronous) circuit 8 is left, dummy wiring lines 18 are formed on all of the remaining regions.

Similar to the above-described condition of the dummy wiring load calculating step 201-2, this dummy wiring line 18 is preferably set to such a state that the dummy wiring line 18 is fixed to either the ground potential or a preset potential of the power supply voltage in order to stabilize the potential. Furthermore, the following shortcircuit condition must be avoided. That is, the dummy wiring line 18 is shortcircuited to the chip wiring line 17.

Then, finally, after the process operation of this core/dummy wiring step 202-3 is accomplished, a wiring load capacitance is calculated under such a state that the dummy wiring line 18 is located in each of the wiring layers of the ASIC chip in the chip operation checking step 202-4. Based upon this calculated wiring load capacitance, the chip operation checking action is carried out so as to confirm the operation of the chip 16.

It should be noted that the wiring load capacitance of the core wiring line 11 calculated in the chip operation checking step 202-4 is equal to the above-explained maximum wiring load capacitance which is calculated in the dummy wiring load calculating step 201-2 and is possibly owned by the core wiring line 11. In other words, the wiring load capacitance calculated in the chip operation checking step 202-4 is equal to such a wiring load capacitance obtained when the operation of the core 11 is checked in the core operation checking step 201-3. The reason is given as follows. That is, the wiring load capacitance of the core wiring line 11 calculated in the chip operation checking step 202-4 is continuously made equal to the above explained maximum wiring load capacitance which is calculated by such an assumption that the dummy wiring line 15 equal to the position of the virtual dummy wiring line 18 is present in addition to the actually arranged chip wiring line 15.

On the other hand, the chip wiring line 17 is formed in a portion of the random logic (single-phase synchronous) circuit 9, and the wiring load capacitance caused by the chip wiring line 17 is added to the core wiring line 12. Since higher precision of the signal transfer time is not required in the core wiring line 12 formed in the random logic (single-phase synchronous) circuit 9 whose operating frequency is low, there is no risk that different logic operations are carried out both in the core operation checking step 201-3 which is executed without being adversely influenced by this wiring load capacitance, and in the chip operation checking step 202-4 which is executed with being adversely influenced by this wiring load capacitance.

Also, since it is prohibited that the chip wiring line 17 passes through the circuit region of the RAM 10, there is no change in the wiring load capacitances owned by the core wiring lines 13 and 14 located before/after the core wiring lines 13 and 14. As a result, there is no risk that different logic operations are carried out.

As a consequence, even when the chip wiring line 17 is arranged at any positions with respect to the core 7 in the chip layout step 202-2, there is no risk that such a logic operation different from the logic operation when the operation of the core 7 is checked in the core operation checking step 201-3 does not occur in the chip operation checking step 202-4.

As previously described in detail, in accordance with the second embodiment, the wiring method specifically owns the core layout grouping step 201-1. In the case that the characteristics of the plural circuits for constituting the core are different from each other, the processing methods as to the respective circuits may be varied based on the circuit characteristics thereof. For instance, while a region for prohibiting the penetration of the chip wiring line is set in the first circuit (RAM 10) among the plural circuits, the processing method of the first embodiment is applied to the third circuit (random logic circuit 8, namely, asynchronous logic circuit) without applying this processing method of the first embodiment to the second circuit (random logic circuit 9, namely, single-phase synchronous circuit). As previously explained, while a single core is subdivided into a plurality of groups, the wiring layout methods are individually varied as to the respective subdivided groups. As a consequence, the wiring lines of the semiconductor integrated circuit adapted to the characteristics of the core can be properly designed without lowering the wiring efficiency achieved when the IC chip is designed.

What is claimed is:

1. A method of arranging/wiring a core used to constitute a semiconductor device on a semiconductor chip, comprising:

providing a core;

arranging a core wiring line on said core;

performing a core operation check to said core on which said core wiring line is arranged;

arranging said core to which said core operation check has been performed, on a semiconductor chip to produce an arranged core;

making a first wiring line capacitance of said core wiring line of said arranged core equal to a second wiring line capacitance of said core wiring line of said core when said core operation check of said core is performed; and performing a chip operation check to said semiconductor chip on which said arranged core is arranged under a condition that said first wiring line capacitance is equal to said second wiring line capacitance.

2. A method according to claim 1, wherein said performing said core operation check of said core includes:

arranging a first dummy wiring line on said core such that said core wiring line of said core has a maximum wiring line capacitance between said first dummy wiring line and said core wiring line;

calculating a value of a wiring line capacitance of said core wiring line when said first dummy wiring line is arranged; and performing said core operation check based on said calculated wiring line capacitance value, and wherein said making said first wiring line capacitance equal to said second wiring line capacitance includes:

arranging a chip wiring line on said semiconductor chip on which said arranged core is arranged to produce an arranged chip; and arranging a second dummy wiring line on said arranged core of said arranged chip at a portion where said chip wiring line is not arranged, of a portion where said first dummy wiring line is arranged.

3. A method according to claim 2, wherein said performing said chip operation check of said semiconductor chip includes:

calculating a value of a second wiring line capacitance of said core wiring line when said second dummy wiring line is arranged; and performing said chip operation check of said semiconductor chip based on said value of said calculated second wiring line capacitance.

4. A method according to claim 2, wherein said arranging said first dummy wiring line includes:

arranging said first dummy wiring line on said core at a portion close to said core wiring line such that said first dummy wiring line has a substantially same length at least as that of said core wiring line along said core wiring line.

5. A method according to claim 2, wherein said arranging said chip wiring line includes:

arranging said chip wiring line under a condition that said chip wiring line can pass through a substantially entire portion of said core.

6. A method according to claim 2, wherein said calculating said value of said wiring line capacitance includes:

calculating a value of parasitic capacitance per unit length, produced when a wiring line is arranged adjacent to said core wiring line; and calculating said value of said wiring line capacitance based on said calculated parasitic capacitance per unit length, a length of said core wiring line, and a length of said first dummy wiring line.

7. A method according to claim 2, wherein said arranging said first dummy wiring line on said core includes arranging said first dummy wiring line on a first layer different from a second layer on which said core wiring line is arranged, and wherein said calculating said value of said wiring line capacitance includes:

calculating a value of an interlayer wiring line parasitic capacitance per unit length, produced when a wiring line is arranged on said first layer; and calculating said value of said wiring line capacitance based on said calculated interlayer wiring line parasitic capacitance per unit length, a length of said core wiring line, and a length of said first dummy wiring line.

8. A method according to claim 2, wherein said calculating said value of said wiring line capacitance includes calculating said value of said wiring line capacitance under a condition that a potential of said first dummy wiring line is fixed to one of a ground potential and a predetermined potential.

9. A method according to claim 1, wherein said providing said core includes providing said core constituted of a plurality of blocks and wherein said making said first wiring line capacitance equal to said second wiring line capacitance includes making said first wiring line capacitance equal to said second wiring line capacitance with respect to at least one block selected from said plurality of blocks of said core.

10. A method according to claim 2, wherein said providing said core includes providing said core constituted of a plurality of blocks and wherein said arranging said chip wiring line includes:
arranging said chip wiring line on a first block of said plurality of blocks under a condition that said chip wiring line can pass through a substantially entire portion of said first block; and
arranging said chip wiring line on a second block of said plurality of blocks under a condition that said chip wiring line is prohibited to pass through said second block.

11. A method according to claim 9, wherein the arranging said first dummy wiring line on said core includes arranging said first dummy wiring line on said selected block without arranging said first dummy wiring line on at least one block other than said selected block of said plurality of blocks.

12. A method according to claim 11, wherein each of said selected block and said block other than said selected block has a circuit characteristic different from each other.

13. A semiconductor device arranging/wiring apparatus for arranging/wiring a core used to constitute a semiconductor device on a semiconductor chip, comprising:
means for providing a core;
means for arranging a core wiring line on said core;
means for performing a core operation check to said core on which said core wiring line is arranged;
means for arranging said core to which said core operation check has been performed, on a semiconductor chip to produce an arranged core;
means for making a first wiring line capacitance of said core wiring line of said arranged core equal to a second wiring line capacitance of said core wiring line of said core when said core operation check of said core is performed; and
means for performing a chip operation check to said semiconductor chip on which said arranged core is arranged under a condition that said first wiring line capacitance is equal to said second wiring line capacitance.

14. A apparatus according to claim 13, wherein said means for performing said core operation check of said core includes:
means for arranging a first dummy wiring line on said core such that said core wiring line of said core has a maximum wiring line capacitance between said first dummy wiring line and said core wiring line;
means for calculating a value of a wiring line capacitance of said core wiring line when said first dummy wiring line is arranged; and
means for performing said core operation check based on said calculated wiring line capacitance value, and
wherein said means for making said first wiring line capacitance equal to said second wiring line capacitance includes:
means for arranging a chip wiring line on said semiconductor chip on which said arranged core is arranged to produce an arranged chip; and
means for arranging a second dummy wiring line on said arranged core of said arranged chip at a portion where said chip wiring line is not arranged, of a portion where said first dummy wiring line is arranged.

15. A apparatus according to claim 14, wherein said means for performing said chip operation check of said semiconductor chip includes:
means for calculating a value of a second wiring line capacitance of said core wiring line when said second dummy wiring line is arranged; and
means for performing said chip operation check of said semiconductor chip based on said value of said calculated second wiring line capacitance.

16. A apparatus according to claim 14, wherein said means for arranging said first dummy wiring line includes:
means for arranging said first dummy wiring line on said core at a portion close to said core wiring line such that said first dummy wiring line has a substantially same length at least as that of said core wiring line along said core wiring line.

17. A apparatus according to claim 14, wherein said means for arranging said chip wiring line includes:
means for arranging said chip wiring line under a condition that said chip wiring line can pass through a substantially entire portion of said core.

18. A apparatus according to claim 14, wherein said means for calculating said value of said wiring line capacitance includes:
means for calculating a value of parasitic capacitance per unit length, produced when a wiring line is arranged adjacent to said core wiring line; and
means for calculating said value of said wiring line capacitance based on said calculated parasitic capacitance per unit length, a length of said core wiring line, and a length of said first dummy wiring line.

19. A apparatus according to claim 14, wherein said means for arranging said first dummy wiring line on said core includes means for arranging said first dummy wiring line on a first layer different from a second layer on which said core wiring line is arranged, and
wherein said means for calculating said value of said wiring line capacitance includes:
means for calculating a value of an interlayer wiring line parasitic capacitance per unit length, produced when a wiring line is arranged on said first layer; and
means for calculating said value of said wiring line capacitance based on said calculated interlayer wiring line parasitic capacitance per unit length, a length of said core wiring line, and a length of said first dummy wiring line.

20. A apparatus according to claim 14, wherein said means for calculating said value of said wiring line capacitance includes means for calculating said value of said wiring line capacitance under a condition that a potential of said first dummy wiring line is fixed to one of a ground potential and a predetermined potential.

21. A apparatus according to claim 13, wherein said means for providing said core includes means for providing said core constituted of a plurality of blocks and
wherein said means for making said first wiring line capacitance equal to said second wiring line capacitance includes means for making said first wiring line capacitance equal to said second wiring line capacitance with respect to at least one block selected from said plurality of blocks of said core.

22. A apparatus according to claim 14, wherein said means for providing said core includes means for providing said core constituted of a plurality of blocks and
wherein said means for arranging said chip wiring line includes:

means for arranging said chip wiring line on a first block of said plurality of blocks under a condition that said chip wiring line can pass through a substantially entire portion of said first block; and means for arranging said chip wiring line on a second block of said plurality of blocks under a condition that said chip wiring line is prohibited to pass through said second block.

23. A apparatus according to claim 21, wherein said means for arranging said first dummy wiring line on said core includes means for arranging said first dummy wiring line on said selected block without arranging said first dummy wiring line on at least one block other than said selected block of said plurality of blocks.

24. A apparatus according to claim 23, wherein each of said selected block and said block other than said selected block has a circuit characteristic different from each other.

* * * * *